(12) United States Patent
Cho

(10) Patent No.: US 10,353,304 B2
(45) Date of Patent: Jul. 16, 2019

(54) IMPRINT TEMPLATES WITH ALIGNMENT MARKS AND METHODS OF FORMING IMPRINT PATTERNS USING THE SAME

(71) Applicant: SK hynix Inc., Gyeonggi-do (KR)

(72) Inventor: Jung Bin Cho, Jeollabuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/788,974

(22) Filed: Oct. 20, 2017

(65) Prior Publication Data

US 2018/0259862 A1 Sep. 13, 2018

(30) Foreign Application Priority Data

Mar. 8, 2017 (KR) ........................ 10-2017-0029695

(51) Int. Cl.
*G03F 9/00* (2006.01)
*G03F 7/00* (2006.01)

(52) U.S. Cl.
CPC .......... *G03F 9/7042* (2013.01); *G03F 7/0002* (2013.01); *G03F 9/7003* (2013.01)

(58) Field of Classification Search
CPC ........ G03F 7/0002; G03F 9/7003; G03F 1/20; G03F 1/42; G03F 1/50; G03F 1/68; G03F 9/7042
See application file for complete search history.

(56) References Cited

U.S. PATENT DOCUMENTS

| | | | |
|---|---|---|---|
| 2007/0187875 A1* | 8/2007 | Terasaki | B82Y 10/00 264/496 |
| 2013/0078821 A1* | 3/2013 | Furutono | G03F 7/0002 438/780 |
| 2016/0067910 A1* | 3/2016 | Suzuki | G03F 7/0002 264/488 |
| 2016/0076132 A1 | 3/2016 | Suzuki et al. | |

FOREIGN PATENT DOCUMENTS

KR 1020140027281 3/2014

\* cited by examiner

*Primary Examiner* — Michelle M Iacoletti
(74) *Attorney, Agent, or Firm* — IP & T Group LLP

(57) ABSTRACT

There is provided a method of performing a nanoimprint lithography process. The method includes providing an imprint template having field patterns and an alignment mark. The field patterns are defined by a concave and convex surface profile of each of field regions of the imprint template, and the alignment mark is embedded in a boundary region of the imprint template. A resist layer is formed on a substrate having a reference alignment mark. The field patterns are imprinted on the resist layer to embed the field patterns into the resist layer while the imprint template is aligned with the substrate using the alignment mark and the reference alignment mark. Related imprint template structures are also provided.

14 Claims, 12 Drawing Sheets

IMPRINT TEMPLATES WITH ALIGNMENT MARKS AND METHODS OF FORMING IMPRINT PATTERNS USING THE SAME

CROSS-REFERENCE TO RELATED APPLICATIONS

The present application claims priority under 35 U.S.C. 119(a) to Korean Application No. 10-2017-0029695, filed on Mar. 8, 2017, which is incorporated herein by reference in its entirety.

BACKGROUND

1. Technical Field

Various embodiments of the present disclosure relate to techniques of forming fine patterns and, more particularly, to imprint templates with alignment marks used in a nanoimprint lithography process and methods of forming imprint patterns using the same.

2. Related Art

In the semiconductor industry, a lot of effort has been focused on developing technologies for transferring fine pattern images onto a wafer in order to realize integrated circuits with a high integration density. A nanoimprint lithography (NIL) technique has been evaluated as an attractive lithography technique which is efficiently usable for fabrication of nanostructures at a low cost. According to a typical NIL technique, a stamp, a template or a mold in which nanostructures are carved may be put on a resist layer which is spin-coated or dispensed on a wafer or a substrate, and may be pressed toward the resist layer to transfer the nanostructures into the resist layer.

An imprint template corresponding to a reticle used in a typical photolithography process may be employed in the NIL process. The imprint template may be configured to include a field pattern portion having field patterns to be transferred into a resist layer, alignment marks used in an alignment step for aligning a wafer with the imprint template, and overlay vernier patterns used as assist patterns of the alignment marks. Since the imprint template is in direct contact with the resist layer coated on the wafer to transfer features of the carved patterns into the resist layer, the assist patterns as well as the field patterns may also be transferred into the resist layer. Accordingly, the assist patterns transferred into the resist layer may act as defects of the NIL process or may affect a subsequent process.

SUMMARY

Various embodiments are directed to an imprint template structure having an alignment mark which is not imprinted by concave and convex patterns, and a method of forming imprint patterns.

According to an embodiment, there is provided a method of forming imprint patterns. The method includes providing an imprint template including at least one field region, a boundary region. Field patterns may be defined in the at least one field region and an alignment mark may be embedded in the boundary region. A resist layer is formed on a substrate having a reference alignment mark. The alignment mark of the imprint template may be aligned with the reference alignment mark of the substrate structure. The field patterns are imprinted on the resist layer to embed the field patterns into the resist layer.

According to another embodiment, there is provided a method of forming imprint patterns. The method includes providing a first imprint template including first field patterns and a first alignment mark. The first field patterns are defined by a concave and convex surface profile of the first imprint template, and the first alignment mark is embedded in a mesa portion of the first imprint template. A first pattern target layer and a first resist layer are sequentially formed on a substrate having a reference alignment mark. A first imprint process for embedding the first field patterns into the first resist layer is performed to form first resist patterns while the first imprint template is aligned with the substrate using a relative position of the first alignment mark to the reference alignment mark. The first pattern target layer is etched using the first resist patterns as etch masks to form first target patterns. A second resist layer is formed to cover the first target patterns. A second imprint template is loaded onto the second resist layer. The second imprint template includes second field patterns defined by a concave and convex surface profile of the second imprint template and a second alignment mark embedded in a mesa portion of the second imprint template. A second imprint process for embedding the second field patterns into the second resist layer is performed while the second imprint template is aligned with the substrate using a relative position of the second alignment mark to the reference alignment mark.

According to yet another embodiment, an imprint template includes a mesa portion protruding from a body portion, field patterns defined by a concave and convex surface profile of a field region of the mesa portion, and an alignment mark embedded in a boundary region of the mesa portion. The alignment mark has a light transmittance which is lower than a light transmittance of the mesa portion.

BRIEF DESCRIPTION OF THE DRAWINGS

Various embodiments and advantages of the present disclosure will become more apparent in view of the attached drawings and accompanying detailed description, in which.

DETAILED DESCRIPTION OF THE EMBODIMENTS

Figure 1:
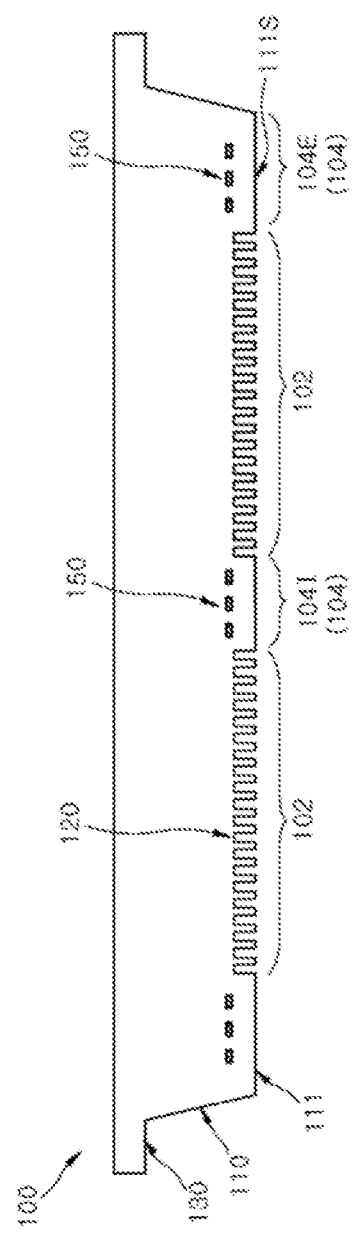
FIG. 1 is a cross-sectional view illustrating an imprint template according to an embodiment of the present invention.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element, but not used to define only the element itself or to denote a particular sequence. Thus, a first element in some embodiments could be termed a second element in other embodiments without departing from the teachings of the inventive concept.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

The following embodiments may be implemented with any suitable integrated circuits such as dynamic random-access memory (DRAM) devices, phase change random access memory (PcRAM) devices or resistive random-access memory (ReRAM) devices. Moreover, the following embodiments may be implemented with any suitable memory devices such as static random-access memory (SRAM) devices, flash memory devices, magnetic random-access memory (MRAM) devices or ferroelectric random-access memory (FeRAM) devices. Furthermore, the following embodiments may be implemented with logic devices having integrated logic circuits.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIG. 1 is a cross-sectional view illustrating an imprint template 100, according to an embodiment of the present invention.

Referring to FIG. 1, the imprint template 100 used in a nanoimprint lithography (NIL) process may have a patterned surface and may include field patterns 120 formed at the flat patterned surface 111. During the NIL process, the field patterns 120 may be imprinted into a resist layer which is formed on a substrate or a wafer to form fine patterns. The field patterns 120 formed at the flat patterned surface 111 may be comprised of concave and convex patterns having a nano-scaled structure. The imprint template 100 may include a body portion 130 and a mesa portion 110 protruding from the body portion 130. The body portion 130 and the mesa portions 110 may be an integral part or may be two separate parts coupled together via one or more means such as mechanical coupling means or an adhesive. The mesa portion 110 may have the patterned surface 111 providing the field patterns 120, and the body portion 130 may support the mesa portion 110. There may be a level difference between an edge of the mesa portion 110 and an edge of the body portion 130. The mesa portion 110 may have a smaller footprint and a larger thickness than the body portion 130.

The patterned surface 111 may have at least one field region where the field patterns 120 are provided. An entire region of the patterned surface 111 may correspond to an imprinting shot region defined by a single shot of the NIL process. Thus, all of the field patterns 120 provided by the patterned surface 111 may be imprinted by a single shot of the NIL process. The number of the field regions 102 in the patterned surface 111 may be set to be different according to various embodiments. For example, in some embodiments, the number of the field region 102 may be one. Alternatively, in some other embodiments, the patterned surface 111 may have two or more field regions 102 which are spaced apart from each other by a boundary region 104. While the field patterns 120 are disposed in the field region 102, various assist patterns such as alignment marks 150 and overlay vernier patterns (not shown) may be provided in the boundary region 104. The boundary region 104 may include an edge boundary region 104E corresponding to an edge of the patterned surface 111 and an intermediate boundary region disposed between the field regions 102. In the event that the field regions 102 correspond to cell regions of two or more semiconductor devices, the boundary region 104 may be a scribe lane region.

The alignment marks 150 may be embedded in the boundary region 104 (for example, 104I and 104E) of the mesa portion 110 and may be located adjacent or near a substantially flat surface 111S of the patterned surface 111. Since the alignment marks 150 are not comprised of protruded patterns or recessed patterns, the flat surface 111S of the patterned surface 111 does not have any convex or concave profile. Accordingly, the alignment marks 150 are not imprinted into the resist layer during the NIL process of imprinting the field patterns 120 into the resist layer.

The alignment marks 150 may have a light transmittance which is different from a light transmittance of the mesa portion 110 of the imprint template 100. For example, the mesa portion 110 of the imprint template 100 may be comprised of a substantially transparent material through which light such as ultraviolet rays or visible rays is able to pass. In an embodiment, the body portion 130 and the mesa portion 110 of the imprint template 100 may be comprised of a quartz material. The alignment marks 150 may be comprised of a material having a light transmittance which is lower than a light transmittance of the mesa portion 110 of the imprint template 100. For example, preferably, the alignment marks 150 may have a light transmittance ranging from about 10 percent to about 80 percent of a light transmittance of the mesa portion 110 of the imprint template 100, and more preferably from about 10 percent to about 60 percent of a light transmittance of the mesa portion 110 of the imprint template 100. Each of the alignment marks 150 may be comprised of fine-sized crystalline phase regions which are formed in the mesa portion 110 of the imprint template 100. When the mesa portion 110 of the imprint template 100 is substantially comprised of an amorphous material, the fine-sized crystalline phase region formed in the amorphous material may look like a scratch. That is, the fine-sized crystalline phase regions formed in the mesa portion 110 may constitute each of the alignment marks 150 to have a light transmittance which is lower than a light transmittance of the mesa portion 110.

Figure 2:
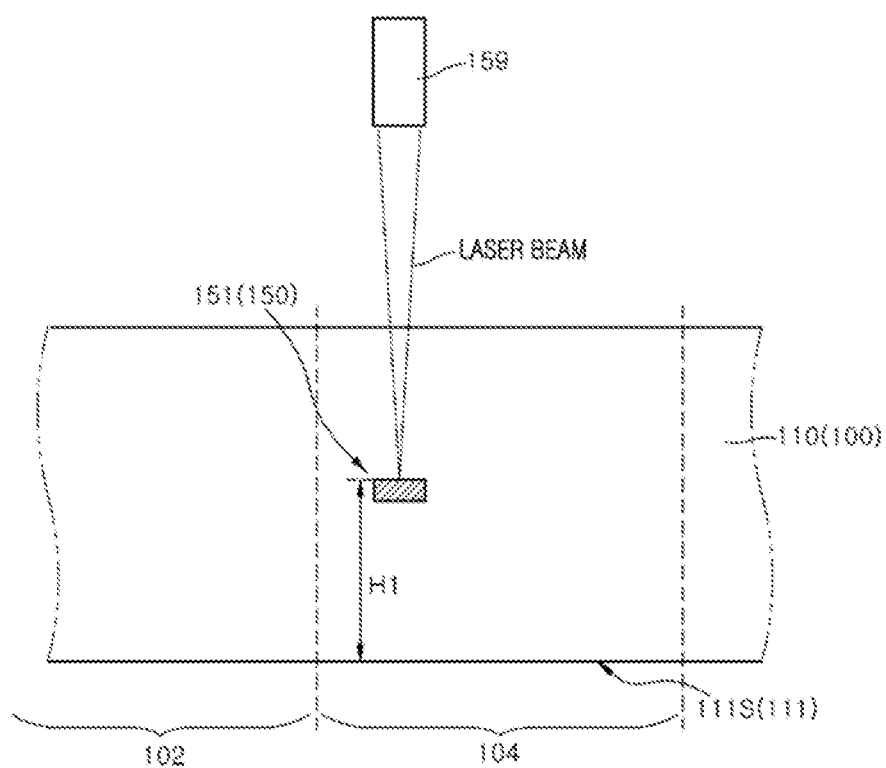
FIGS. 2 and 3 are cross-sectional views illustrating the forming of alignment marks in an imprint template according to an embodiment of the present invention.
Figure 3:
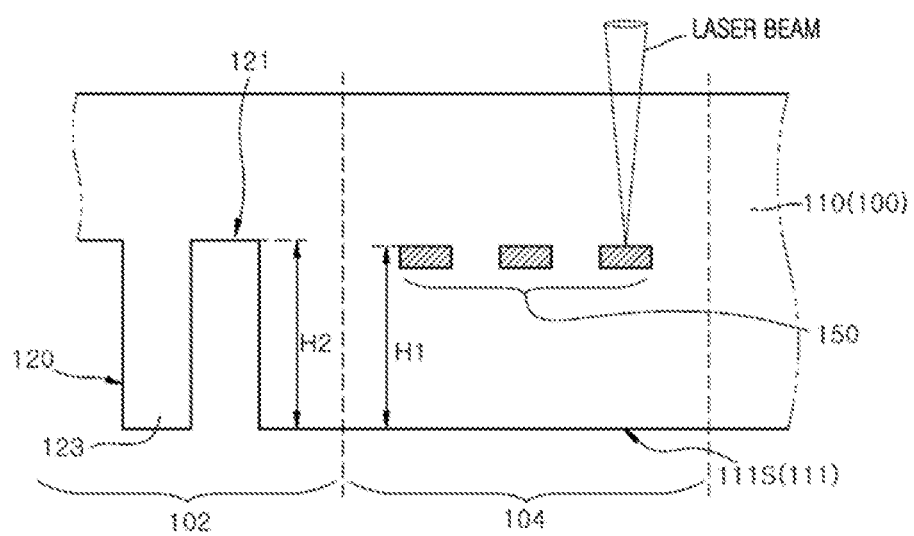
Figure 4:
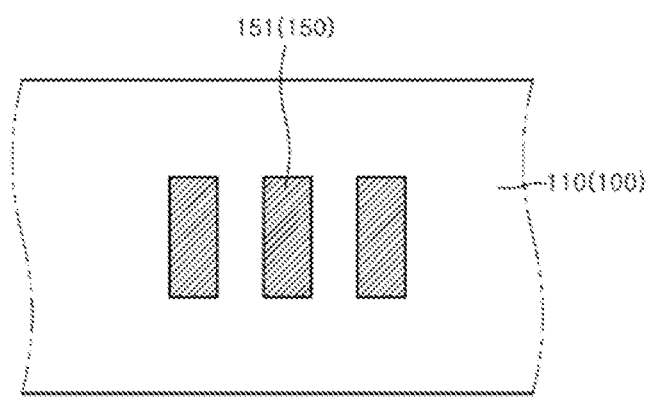
FIG. 4 is a plan view illustrating alignment marks formed in an imprint template according to an embodiment of the present invention.
Figure 5:
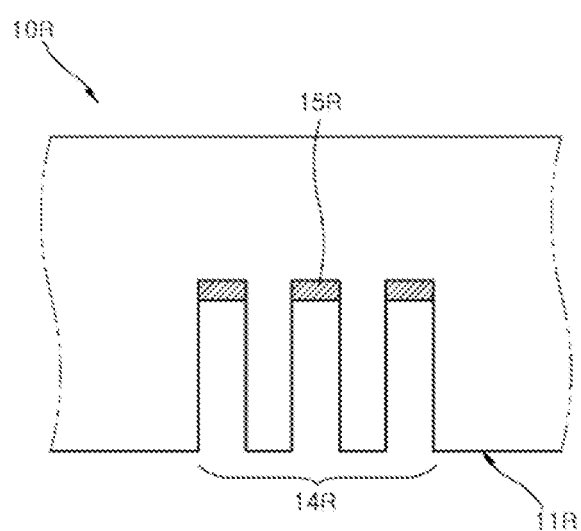
FIG. 5 is a cross-sectional view illustrating alignment marks formed in an imprint template as a comparative example.

FIGS. 2 and 3 are cross-sectional views illustrating the forming the alignment marks 150 in the imprint template 100 according to an embodiment of the present invention, FIG. 4 is a plan view illustrating the alignment marks 150 formed in the imprint template 100 according to an embodiment of the present invention, and FIG. 5 is a cross-sectional view illustrating alignment marks formed in an imprint template 10R as a comparative example.

Referring to FIG. 2, each of the alignment marks 150 may be formed by irradiating a laser beam into the mesa portion 110 of the imprint template 100. The laser beam may be irradiated onto a surface of the body portion 130 opposite to the mesa portion 110 and may be focused on a portion in the mesa portion 110, which is spaced apart from the flat surface 111S of the patterned surface 111 by a distance corresponding to a first depth H1. A phase of the portion of the mesa portion 110 which is irradiated by the laser beam may in his way become a crystalline phase. As noted earlier, the mesa portion 110 initially has an amorphous phase and only the part of the mesa portion 110 which is irradiated by the laser beam becomes crystalline. As a result, the crystalline phases formed by irradiation of the laser beam may constitute a single opaque pattern 151. The opaque pattern 151 may have a fine size and may induce dispersion of light. Accordingly, the opaque pattern 151 may have a light transmittance which is lower than a light transmittance of the mesa portion 110. A laser irradiator 159 may generate the laser beam and may operate to focus the laser beam on a portion of the mesa portion 110. A position of the opaque patterns 151 constituting the alignment mark 150 may be determined according to a position on which the laser beam is focused. Thus, the first depth H1 may be readily controlled by changing a focal distance of the laser beam generated by the laser irradiator 159.

Referring to FIG. 3, the laser beam may be sequentially and repeatedly irradiated onto portions of the imprint template 100 to form the opaque patterns 151 which are spaced apart from each other to constitute the alignment mark 150. The alignment mark may be formed to include a plurality of bar-shaped or rectangle-shaped patterns which are arrayed in parallel when viewed from a plan view, as illustrated in FIG. 4. The laser beam may be scanned on portions of the imprint template 100 so that the alignment mark is formed to have an array of bars.

The alignment mark 150 may be formed in the boundary region 104. The field patterns 120 may be formed to have concave and convex patterns at the patterned surface 111 of each field region 102. The field patterns 120 may be formed to include relatively protruded end portions 123 defined by a plurality of concave regions which are by selectively applying an etching process to portions of the patterned surface 111 in each field region 102. The concave regions 121 may be formed to have a second depth H2 from the flat surface 111S of the patterned surface 111. The second depth H2 may be substantially equal to the first depth H1 at which the alignment mark 150 is formed. That is, the alignment mark 150 may be located at substantially the same level as bottom surfaces of the concave regions 121 of the field patterns 120. The flat surface 111S of the patterned surface 111, which is adjacent to the alignment mark 150, may be substantially flat without any concave and convex patterns. End surfaces of the protruded end portions may be coplanar with the flat surface 111S of the patterned surface 111 that vertically overlaps with the alignment mark 150.

The alignment marks 150 may be formed before the field patterns 120 are formed in the field regions 102. Alternatively, the alignment marks 150 may be formed after the field patterns 120 are formed in the field regions 102. Since the alignment marks 150 are formed using a laser beam, a process for forming the alignment marks 150 may not be influenced by an etching process for forming the field patterns 120. Thus, the alignment marks 150 may be independently formed before or after the field patterns 120 are formed in the field regions 102.

The imprint template 100 illustrated in FIG. 3 may include the alignment mark 150 embedded in the mesa portion 110 of the boundary region 104. In contrast, an alignment mark of a typical imprint template 10R illustrated in FIG. 5 may include concave and convex patterns 14R provided by a patterned surface 11R, and light blocking patterns 15R respectively disposed in concave regions of the concave and convex patterns 14R. The light blocking patterns 15R may be formed of a material blocking ultraviolet rays or visible rays. For example, the light blocking patterns 15R may be formed of a chrome (Cr) layer. While the alignment mark of the typical imprint template 10R includes the concave and convex patterns 14R, the alignment mark 150 of the imprint template 100 according to an embodiment may be embedded in the mesa portion 110 without any concave and convex patterns. Thus, the imprint template 100 may include the flat surface 111S of the patterned surface 111 adjacent to the alignment mark 150. Accordingly, if an NIL process is performed using the imprint template 100 according to an embodiment, no process failure which is due to the concave and convex patterns 14R may occur.

FIGS. 6 to 12 are cross-sectional views illustrating a method of forming imprint patterns using imprint templates according to an embodiment of the present invention.

Figure 6:
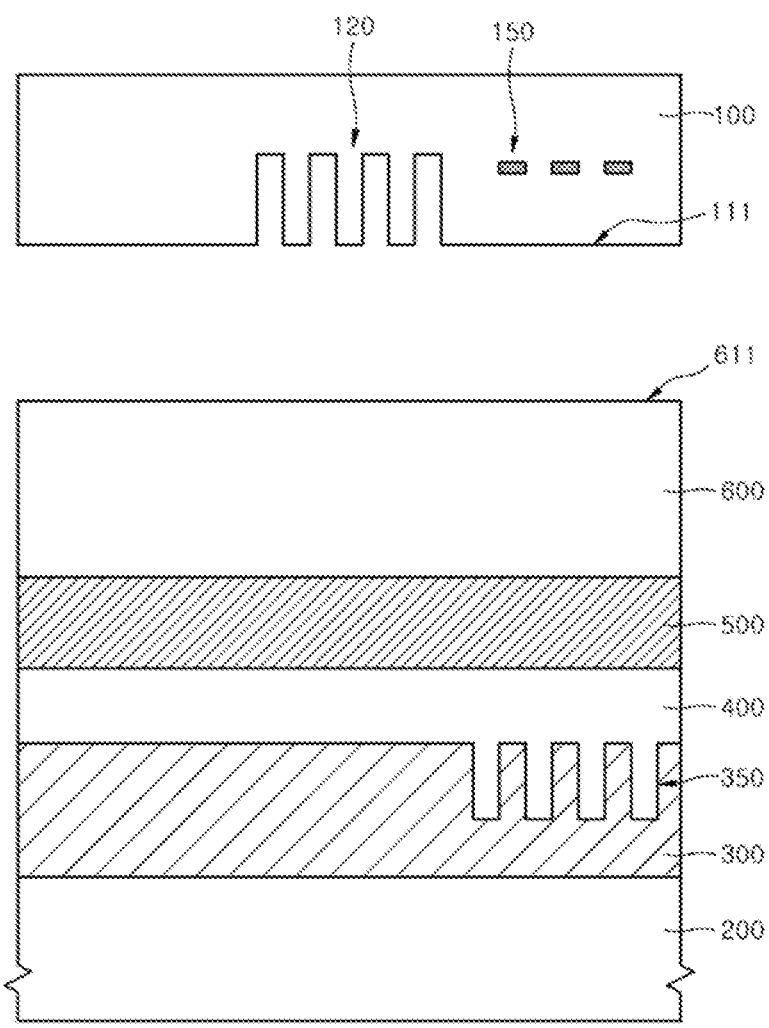
FIGS. 6 to 12 are cross-sectional views illustrating a method of forming imprint patterns using an imprint template according to an embodiment of the present invention.

Referring to FIG. 6, a first imprint template 100 may be provided to apply a first imprint process to a first resist layer 600 on a substrate 200. The first imprint template 100 may include a first alignment mark 150 formed by irradiating a laser beam onto the first imprint template 100, as described with reference to FIGS. 2 and 3.

The substrate 200 may be a semiconductor wafer or a substrate formed of a material other than a semiconductor material. An underlying layer 300 may be formed on the substrate 200. The underlying layer 300 may be a layer in which a reference alignment mark 350 is formed. The reference alignment mark 350 may be used in an alignment process for aligning the first imprint template with the substrate 200. The alignment process may be performed until the first alignment mark 150 of the first imprint template 100 is vertically aligned with the reference alignment mark 350. The reference alignment mark 350 may be formed by etching or recessing portions of the underlying layer 300. The underlying layer 300 may be formed to include lower patterns (not shown) in addition to the reference alignment mark 350.

A first pattern target layer 400 may be formed on the underlying layer 300 having the reference alignment mark 350. The first pattern target layer 400 may be a layer in which first field patterns 120 included in the first imprint template 100 are to be imprinted in a subsequent process. The first pattern target layer may be formed to fill concave regions of the reference alignment mark 350.

A first hard mask layer 500 may be formed between the first resist layer 600 and the first pattern target layer 400. In the event that an etch selectivity of the first resist layer 600 to the first pattern target layer 400 is lower and no mask layer is formed between the first resist layer 600 and the first pattern target layer 400, it may be difficult to accurately transfer images of imprinted patterns in the first resist layer 600 to the first pattern target layer 400 in a subsequent process. The first hard mask layer 500 may be formed to accurately transfer the images of the imprinted patterns in the first resist layer 600 to the first pattern target layer 400 in a subsequent etch process. The first hard mask layer 500 may be formed to include a silicon nitride ($Si_3N_4$) layer, a silicon oxide (SiO$_2$) layer, a silicon oxynitride (SiON) layer or a polycrystalline silicon layer. Alternatively, the first hard mask layer 500 may be formed to include a spin on carbon (SOC) layer.

The first resist layer 600 may be formed on a surface of the first hard mask layer 500 opposite to the first pattern target layer 400. In some embodiments, a buffer layer such as a silicon oxynitride (SiON) layer may be additionally formed between the first resist layer 600 and the first hard mask layer 500. The first resist layer 600 may be formed using a spin coating technique, an ink-jetting technique or a drop dispensing technique.

The first resist layer 600 may be formed of a material in which the first field patterns 120 of the first imprint template 100 are able to be imprinted. That is, the first resist layer 600 may be formed to include an imprintable medium, for example, a resin material. The first resist layer 600 may be formed of a curable coating material that is cured by light such as an ultraviolet ray. The first resist layer 600 may be formed of a resin material or a resist material including photosensitizers.

The first imprint template 100 may be loaded on the substrate 200 so that a first patterned surface 111 of the first imprint template 100 faces a first surface 611 of the first resist layer 600 opposite to the substrate 200. Accordingly, the first field patterns of the first imprint template 100 may face the first surface 611 of the first resist layer 600.

Figure 7:
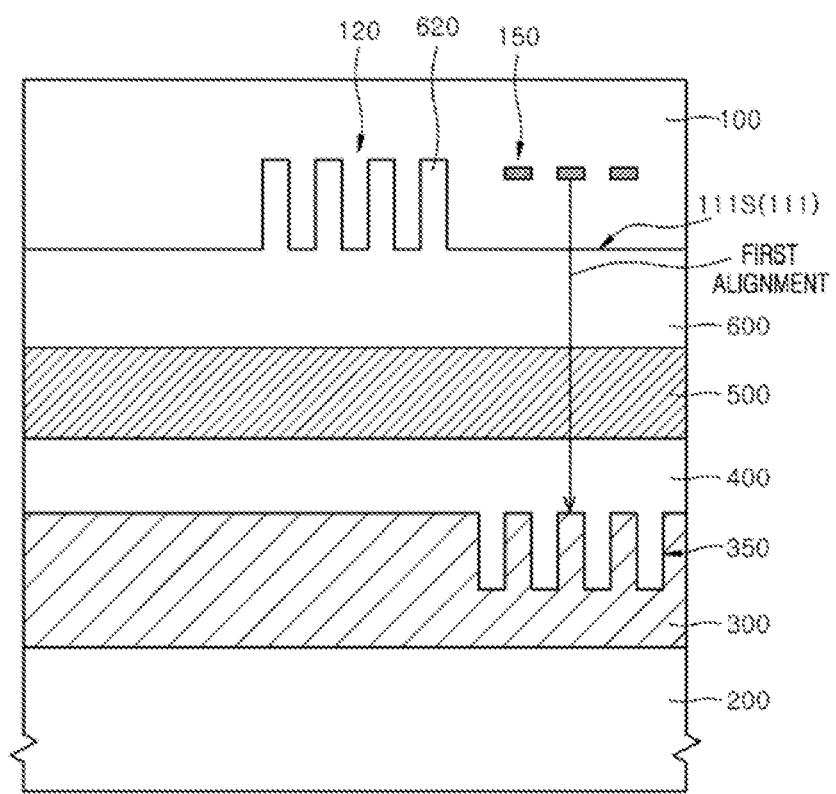

Referring to FIGS. 6 and 7, the first imprint template 100 may move down so that the first field patterns 120 of the first imprint template 100 are brought into contact with the first surface of the first resist layer 600. Subsequently, the first imprint template 100 may be pressed down to perform an imprint process for filling spaces between the first field patterns 120 with the first resist layer 600. As a result, the first field patterns 120 may be embedded into the first resist layer 600. That is, the first field patterns 120 may be imprinted on the first resist layer 600 to form first resist patterns 620.

While the spaces between the first field patterns 120 are fully filled with the first resist layer 600, a first alignment process for vertically aligning the first imprint template 100 with the substrate may be performed. Specifically, a position of the first alignment mark 150 embedded in the first imprint template 100 and a position of the reference alignment mark 350 located in the underlying layer may be optically measured, and a relative position of the first alignment mark 150 to the position of the reference alignment mark may be set as an alignment value. In addition, an interference pattern of the first alignment mark 150 and the reference alignment mark 350 may be measured. The relative position of the first alignment mark 150 to the position of the reference alignment mark or an overlay difference between the first alignment mark 150 and the reference alignment mark 350 may be detected to provide a parameter of an alignment error or an overlay error.

If the alignment error between the first imprint template 100 and the substrate 200 is detected, the substrate 200 may move to perform the first alignment process for compensating for the alignment error between the first imprint template 100 and the substrate 200. That is, the first alignment process for compensating for the alignment error may be performed by moving the substrate in the same direction as the first alignment mark 150 is shifted to the reference alignment mark 350. As a result, the measurement process of the alignment error and the first alignment process for compensating for the alignment error may be repeatedly performed to align the first imprint template 100 with the substrate 200.

After the first imprint template 100 is aligned with the substrate 200, the first resist layer 600 may be cured while the spaces between the first field patterns 120 are still filled with the first resist layer 600. The first resist layer 600 may be cured by irradiating an ultraviolet ray to the first resist layer 600. Since the first imprint template 100 is comprised of a transparent material such as a quartz material, the ultraviolet ray irradiated onto the first imprint template 100 may penetrate the first imprint template 100 to reach the first resist layer 600. Accordingly, the first resist patterns may be hardened by the ultraviolet ray irradiated onto the first imprint template 100.

Figure 8:
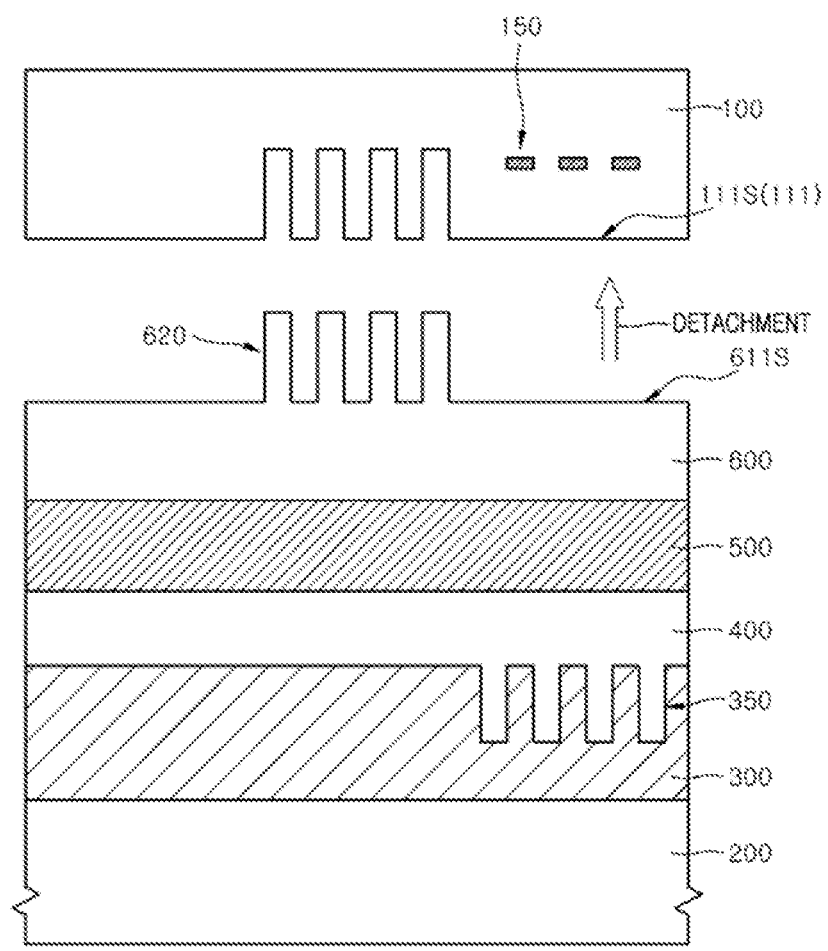

Referring to FIG. 8, the first imprint template 100 may be detached from the first resist layer 600 after the first resist layer 600 including the first resist patterns 620 is cured. Since a flat surface 111S overlapping with the first alignment mark 150 is flat, a surface 611S of the first resist layer 600 being in direct contact with the flat surface flat surface 111S of the first imprint template 100 may also have a flat profile while the first resist layer 600 is cured. Thus, the surface 611S of the first resist layer 600 may maintain a flat profile even after the first imprint template 100 is detached from the first resist layer 600. Accordingly, no process failure which is due to an alignment mark having concave and convex patterns may occur.

The first imprint process described with reference to FIGS. 6 to 8 may correspond to a process performed by a single shot of the NIL process. The single shot of the NIL process may be repeatedly applied to an entire region of the first resist layer 600 using a step and repeat manner. Accordingly, the first imprint process may be sequentially and repeatedly applied to an entire region of the first resist layer 600 if the first resist layer 600 has an area which is greater than an area of the first imprint template 100.

Figure 9:
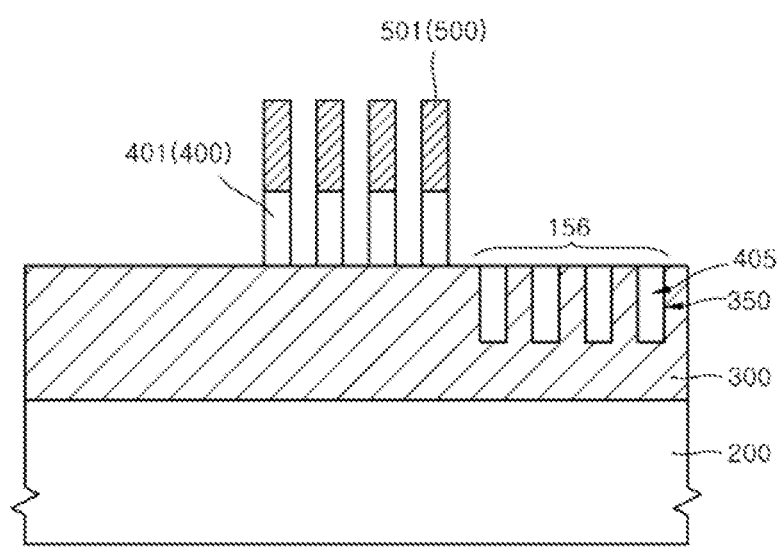

Referring to FIGS. 8 and 9, two-dimensional features of the first resist patterns 620 may be transferred to the first pattern target layer 400 to form first target patterns 401. Specifically, the first resist layer 600 having the first resist patterns 620 may be etched to selectively expose portions of the first hard mask layer 500 which are located under concave regions of the first resist layer 600. After the first resist layer 600 is etched to expose portions of the first hard mask layer 500, only portions of the first resist layer 600 under the first resist patterns 620 may remain on the first hard mask layer 500. The exposed portions of the first hard mask layer 500 may be selectively etched using the remaining portions of the first resist layer 600 as etch masks. As a result, first hard mask patterns 501 may be formed on the first pattern target layer 400. Thus, the first hard mask patterns 501 may be formed to have substantially the same feature as the first resist patterns 620. Subsequently, the first pattern target layer 400 may be etched using the first hard mask patterns 501 as etch masks, thereby forming the first target patterns on the underlying layer 300. Accordingly, the first target patterns 401 may also be formed to have substantially the same feature as the first resist patterns 620.

Since the surface 611S of the first resist layer 600 overlapping with the first alignment mark 150 maintain a flat profile without any concave and convex patterns during the first alignment process, no protruded pattern may be formed on a surface 156 of the underlying layer 300 adjacent to the reference alignment mark 350 after the first target patterns 401 are formed. Although concave regions of the reference alignment mark 350 are filled with remaining portions 405 of the first pattern target layer 400, protruded patterns like the first target patterns 401 may not be formed on the reference alignment mark 350. Thus, the reference alignment mark 350 may maintain its original shape without any damage.

If a protruded pattern or a recessed pattern is formed on the reference alignment mark 350, it may be difficult that the reference alignment mark 350 has its own function. However, according to the embodiment of the present disclosure, the first alignment mark does not cause any formation of a protruded pattern or a recessed pattern on the first resist layer 600 during the first imprint process. Thus, the reference alignment mark 350 may not be damaged by the first alignment mark 150. Accordingly, the reference alignment mark 350 may be successively used as a reference pattern even during a second imprint process which is performed in a subsequent step. That is, when a plurality of imprint processes in association with two or more pattern target layers stacked in a single shot region of the NIL process are performed, the plurality of imprint processes may be performed by sharing a single set of reference alignment marks as a common reference alignment mark. As a result, an area occupied by the reference alignment mark may be reduced.

Figure 10:
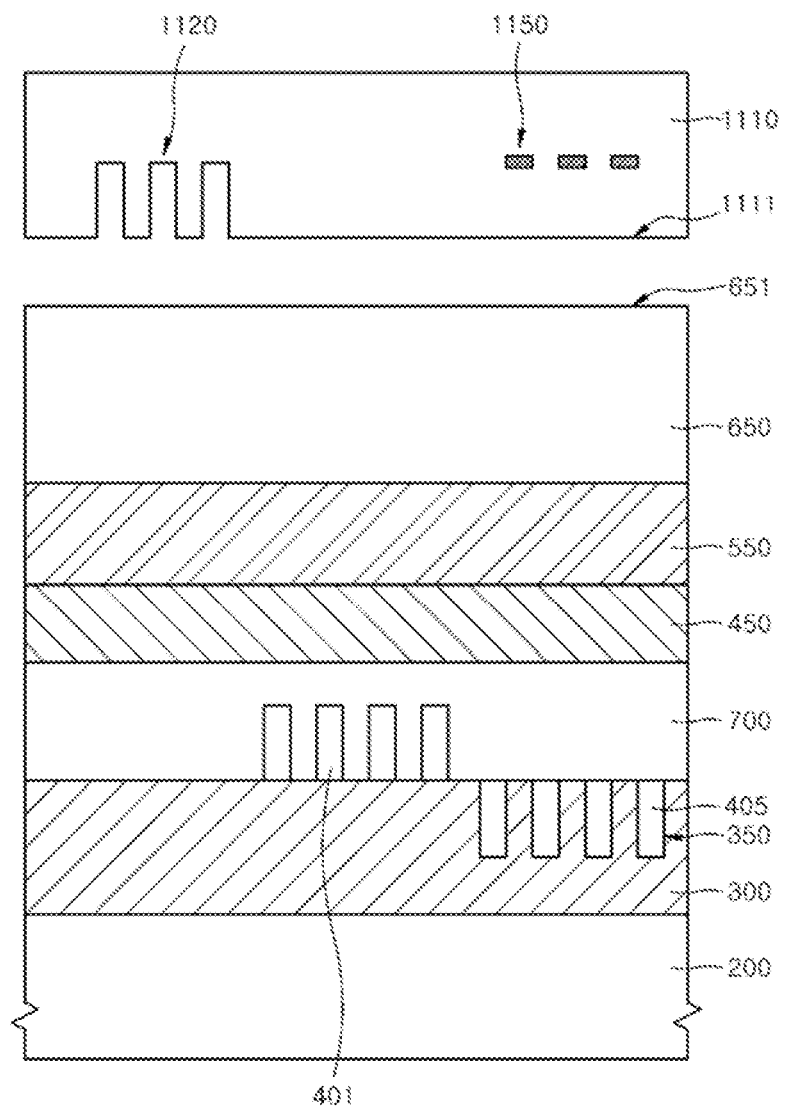

Referring to FIG. 10, a second imprint template 1110 may be provided to apply a second imprint process to a second resist layer on the substrate 200. The second imprint template 1110 may have a configuration which is different from that of the first imprint template (100 of FIG. 6). The second imprint template 1110 may have a second patterned surface 1111 providing second field patterns 1120 comprised of concave and convex patterns. A second alignment mark 1150 may be embedded in the second imprint template 1110 to overlap with a flat portion of the second patterned surface 1111. The second alignment mark 1150 may be provided to align the second imprint template 1110 with the substrate 200. The flat portion of the second patterned surface 1111 overlapping with the second alignment mark 1150 does not have any concave pattern and any convex pattern. The second alignment mark 1150 included in the second imprint template 1110 may also be formed using a laser beam, as described with reference to FIGS. 2 and 3.

An intermediate layer 700 may be formed on the underlying layer 300 to cover the first target patterns 401 and the reference alignment mark 350. The intermediate layer 700 may be an interlayer insulation layer covering the first target patterns 401. A second pattern target layer 450 may be formed on a surface of the intermediate layer 700 opposite to the underlying layer 300. The second pattern target layer 450 may be a layer in which the second field patterns 1120 included in the second imprint template 1110 are to be imprinted in a subsequent process.

A second hard mask layer 550 may be formed on the second pattern target layer 450. The second hard mask layer 550 may be formed to include a spin on carbon (SOC) layer. The second resist layer 650 may be formed on a surface of the second hard mask layer opposite to the second pattern target layer 450. The second resist layer 650 may be formed of a resist material using a spin coating technique. The second imprint template 1110 may be loaded on the substrate 200 so that the second patterned surface of the second imprint template 1110 faces a second surface of the second resist layer 650 opposite to the substrate 200. Accordingly, the second field patterns 1120 of the second imprint template 1110 may face the second surface 651 of the second resist layer 650.

Figure 11:
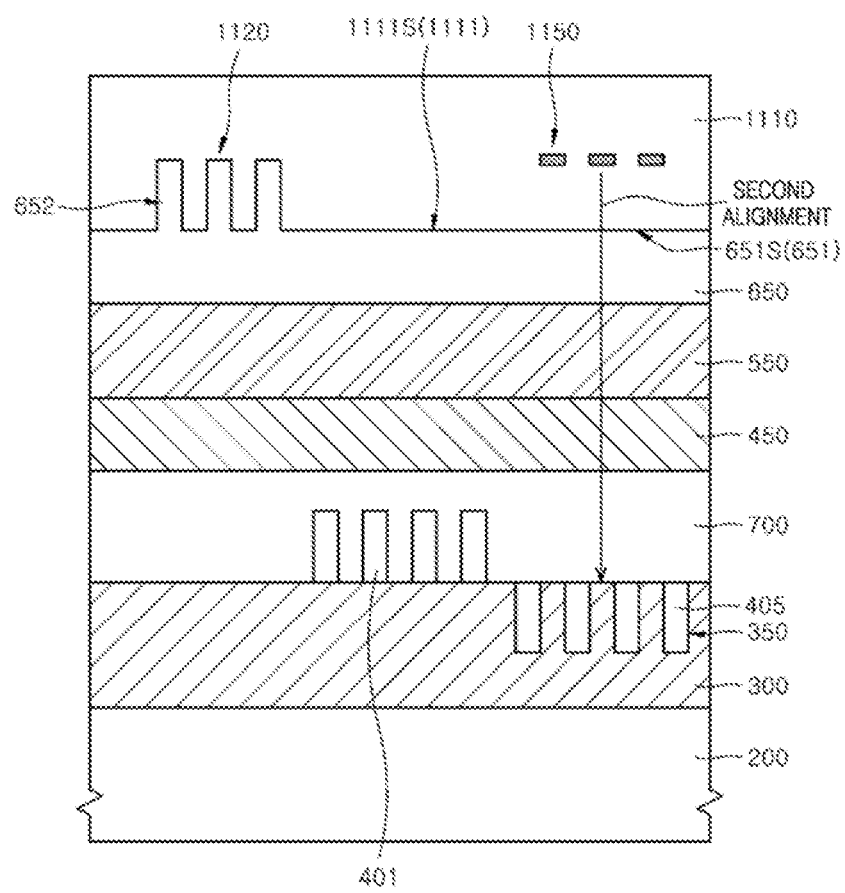

Referring to FIGS. 10 and 11, the second imprint template may move down so that the second field patterns 1120 of the second imprint template 1110 are brought into contact with the second surface 651 of the second resist layer 650.

Subsequently, the second imprint template 1110 may be pressed down to perform an imprint process for filling spaces between the second field patterns 1120 with the second resist layer 650. As a result, the second field patterns 1120 may be embedded into the second resist layer 650. That is, the second field patterns 1120 may be imprinted on the second resist layer 650 to form second resist patterns 652.

While the spaces between the second field patterns 1120 are fully filled with the second resist layer 650, a second alignment process for vertically aligning the second imprint template 1110 with the substrate 200 may be performed. Specifically, a position of the second alignment mark 1150 embedded in the second imprint template 1110 and a position of the reference alignment mark 350 located in the underlying layer 300 may be optically measured, and a relative position of the second alignment mark 1150 to the position of the reference alignment mark 350 may be set as an alignment value. In addition, an interference pattern of the second alignment mark 1150 and the reference alignment mark 350 may be measured. The relative position of the second alignment mark 1150 to the position of the reference alignment mark 350 or an overlay difference between the second alignment mark 1150 and the reference alignment mark 350 may be detected to provide a parameter of an alignment error or an overlay error.

If the alignment error between the second imprint template and the substrate 200 is detected, the substrate 200 may move to perform the second alignment process for compensating for the alignment error between the second imprint template 1110 and the substrate 200. That is, the second alignment process for compensating for the alignment error may be performed by moving the substrate 200 in the same direction as the second alignment mark 1150 is shifted to the reference alignment mark 350. As a result, the measurement process of the alignment error and the second alignment process for compensating for the alignment error may be repeatedly performed to align the second imprint template with the substrate 200.

Both of the first alignment mark 150 included in the first imprint template 100 and the second alignment mark 1150 included in the second imprint template 1110 may be aligned with the reference alignment mark 350. Accordingly, the first and second alignment marks 150 and 1150 may be located at substantially the same position during the first and second alignment processes.

After the second imprint template 1110 is aligned with the substrate 200, the second resist layer 650 may be cured while the spaces between the second field patterns 1120 are still filled with the second resist layer 650. The second resist layer 650 may be cured by irradiating an ultraviolet ray to the second resist layer 650. Since the second imprint template 1110 is comprised of a transparent material such as a quartz material, the ultraviolet ray irradiated onto the second imprint template 1110 may penetrate the second imprint template 1110 to reach the second resist layer 650. Accordingly, the second resist patterns 652 may be hardened by the ultraviolet ray irradiated onto the second imprint template 1110.

The second field patterns 1120 of the second imprint template 1110 or the second resist patterns 652 imprinted by the second field patterns 1120 may be located or formed to be aligned with the first target patterns 401 during the second alignment process. FIG. 11 illustrates an example in which the second field patterns 1120 or the second resist patterns 652 are arranged to not vertically overlap with the first target patterns 401, the present disclosure is not limited thereto. For example, in some embodiments, the second field patterns 1120 or the second resist patterns 652 may be vertically aligned with the first target patterns to overlap with the first target patterns 401 in a plan view.

As described above, the reference alignment mark 350 used as a reference pattern during the first alignment process may also be used as a reference pattern during the second alignment process. That is, the second alignment mark 1150 may also be aligned with the reference alignment mark 350 during the second alignment process. Since the reference alignment mark 350 is not broken or damaged during the first imprint process including the first alignment process, the first imprint process and the second imprint process including the second alignment process may share the reference alignment mark 350 as a reference pattern. In addition, since the second alignment mark 1150 is embedded in the second imprint template 1110 without providing any concave and convex patterns, the reference alignment mark 350 cannot be damaged even during the second imprint process. Thus, it may be possible to share the reference alignment mark 350 as a reference pattern with which a third alignment mark (not shown) is aligned during a third imprint process (not shown) which is able to be performed in a subsequent step. That is, even though multi-layered target patterns are formed on the substrate 200 using a plurality of imprint processes, the plurality of imprint processes can be sequentially performed by sharing the single set of reference alignment mark 350 as a common reference alignment mark. Accordingly, it is possible to reduce an area that the reference alignment mark 350 occupies, and areas of the first and second alignment marks 150 and 1150 may also be reduced.

After the second resist layer 650 is cured, the second imprint template 1110 may be detached from the second resist layer 650. Since a flat surface 1111S overlapping with the second alignment mark 1150 is flat, a surface 651S of the second resist layer 650 being in direct contact with the flat surface 1111S of the second imprint template 1110 may also have a flat profile while the second resist layer 650 is cured. Thus, the surface 651S of the second resist layer 650 may maintain a flat profile even after the second imprint template 1110 is detached from the second resist layer 650. Accordingly, no process failure due to an alignment mark having concave and convex patterns may occur.

The second imprint process performed using the second imprint template 1110 may correspond to a process performed by a single shot of the NIL process. The single shot of the NIL process performed with the second imprint template 1110 may be repeatedly applied to an entire region of the second resist layer 650 using a step and repeat manner. Accordingly, the second imprint process may be sequentially and repeatedly applied to an entire region of the second resist layer 650 if the second resist layer 650 has an area which is greater than an area of the second imprint template 1110.

Figure 12:
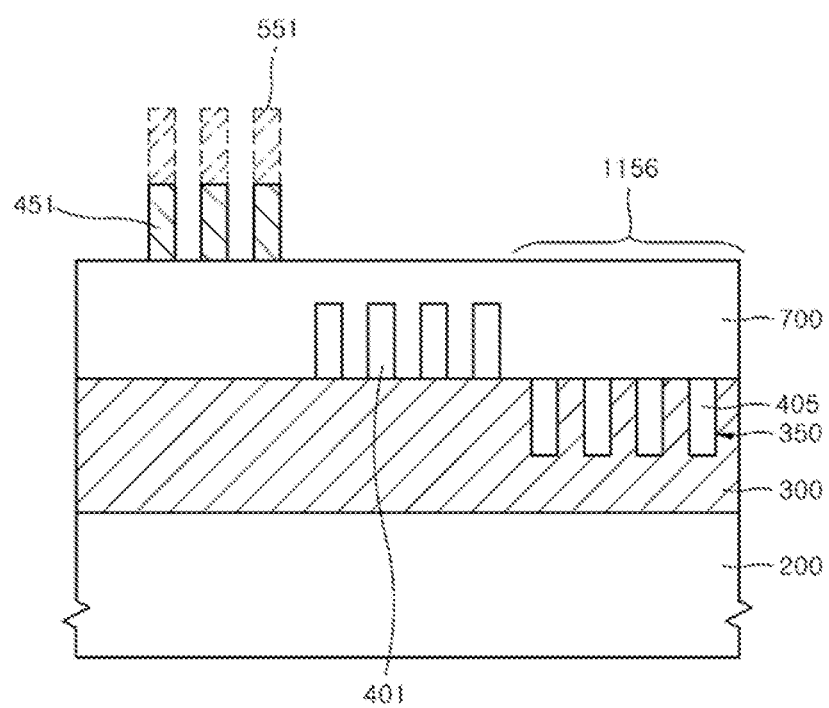

Referring to FIGS. 11 and 12, two-dimensional features of the second resist patterns 652 may be transferred to the second pattern target layer 450 to form second target patterns 451. Specifically, the second resist layer 650 having the second resist patterns 652 may be etched to selectively expose portions of the second hard mask layer 550 which are located under concave regions of the second resist layer 650. After the second resist layer 650 is etched to expose portions of the second hard mask layer 550, only portions of the second resist layer 650 under the second resist patterns 652 may remain on the second hard mask layer 550. The exposed portions of the second hard mask layer 550 may be selectively etched using the remaining portions of the second resist layer 650 as etch masks. As a result, second hard mask patterns 551 may be formed on the second pattern target layer 450. Thus, the second hard mask patterns 551 may be formed to have substantially the same features as the second resist patterns 652. Subsequently, the second pattern target layer 450 may be etched using the second hard mask patterns 551 as etch masks, thereby forming the second target patterns 451 on the intermediate layer 700. Accordingly, the second target patterns 451 may also be formed to have substantially the same features as the second resist patterns 652.

Although FIG. 12 illustrates an example in which the second target patterns 451 are formed in a region which is spaced apart from the first target patterns 401 in a plan view, the present disclosure is not limited thereto. For example, in some embodiments, the second target patterns 451 may be formed to vertically overlap with the first target patterns 401.

Since the surface 651S of the second resist layer 650 overlapping with the second alignment mark 1150 maintain a flat profile without any concave and convex patterns during the second alignment process, no protruded pattern may be formed on a surface of the intermediate layer 700 adjacent to the reference alignment mark 350 after the second target patterns 451 are formed. That is, no patterns are formed on the surface 1156 of the intermediate layer 700 adjacent to the reference alignment mark 350. Accordingly, while the reference alignment mark 350 is scanned by an optical beam to obtain an image of the reference alignment mark during the second alignment process, the image of the reference alignment mark 350 can be clearly provided to successfully perform the second alignment process without any alignment error.

If a protruded pattern or a recessed pattern is formed over the reference alignment mark 350, it may be difficult that the reference alignment mark 350 is used as a reference pattern during an alignment process. However, according to the embodiment of the present disclosure, the second alignment mark 1150 does not cause any formation of a protruded pattern or a recessed pattern on the second resist layer 650 during the second imprint process. Thus, the reference alignment mark 350 cannot be damaged by the second alignment mark 1150. Accordingly, the reference alignment mark may be used successively as a reference pattern even during a third imprint process which may be performed in a subsequent step. For example, when a plurality of imprint processes in association with two or more pattern target layers which are stacked in a single shot region of the NIL process are performed, the plurality of imprint processes may be performed by sharing a single set of reference alignment marks as a common reference alignment mark. As a result, an area occupied by the reference alignment mark may be reduced.

Figure 13:
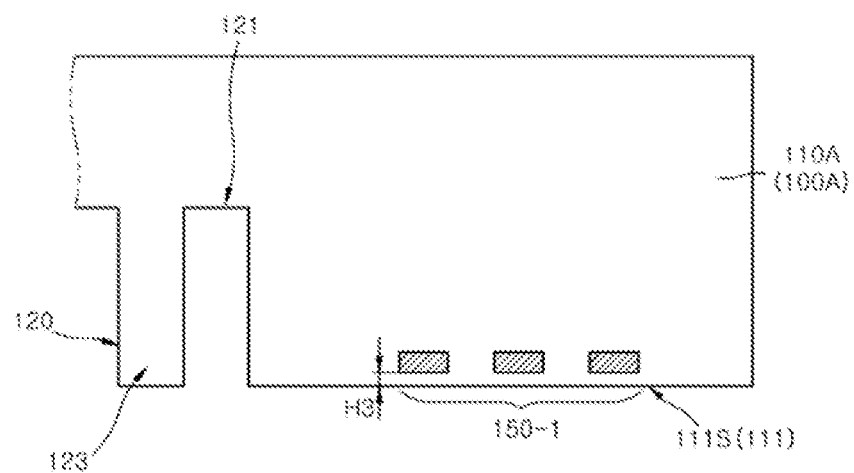
FIG. 13 is a cross-sectional view illustrating an alignment mark formed in an imprint template according to another embodiment of the present invention.
Figure 14:
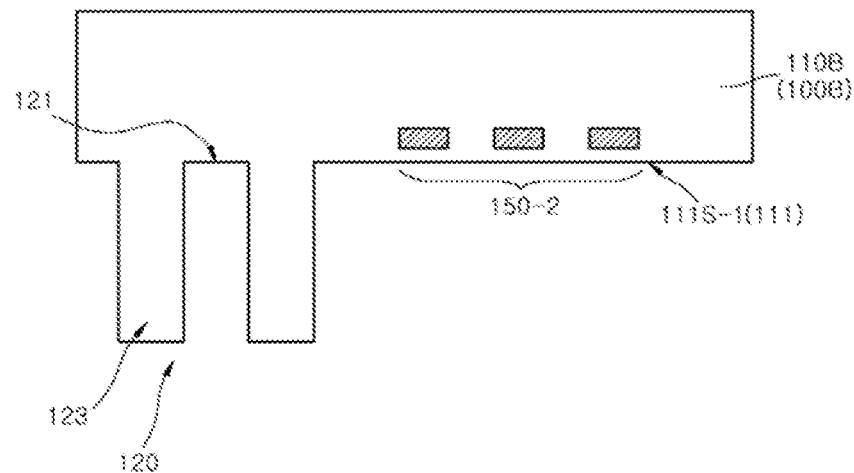
FIG. 14 is a cross-sectional view illustrating an alignment mark formed in an imprint template according to yet another embodiment of the present invention.

FIG. 13 is a cross-sectional view illustrating an alignment mark 150-1 formed in a mesa portion 110A of an imprint template 100A according to another embodiment of the present invention, and FIG. 14 is a cross-sectional view illustrating an alignment mark 150-2 formed in a mesa portion 110B of an imprint template 1008 according to yet another embodiment of the present invention.

Referring to FIG. 13, the alignment mark 150-1 embedded in the mesa portion 110A of the imprint template 100A may be located at a third depth H3 from the flat surface 111S of the patterned surface 111 adjacent to the alignment mark 150-1. End surfaces of the protruded end portions 123 of the field patterns 120 may be located at substantially the same level as the flat surface 111S of the patterned surface 111. In such a case, the third depth H3 may be less than a height of the field patterns 120.

Referring to FIG. 14, a flat surface 111S-1 of the patterned surface 111 adjacent to the alignment mark 150-2 may be recessed to be located at substantially the same level as bottom surfaces of the concave regions 121 of the field patterns 120. That is, even though the field patterns 120 are formed to protrude from the flat surface 111S-1 of the patterned surface 111, the alignment mark 150-2 may be embedded in the mesa portion 110B and may be located to be adjacent to the flat surface 111S-1 of the patterned surface 111. As such, the alignment mark 150-1 or 150-2 may be located at a different position according to the embodiments.

The embodiments of the present disclosure have been disclosed for illustrative purposes. Those skilled in the art will appreciate that various other modifications, additions and substitutions are possible, without departing from the scope and spirit of the present disclosure and the accompanying claims.

What is claimed is:

1. A method of performing a nanoimprint lithography process, the method comprising:
    providing an imprint template including at least one field region, a boundary region, field patterns defined in the at least one field region, and an alignment mark embedded in the boundary region;
    forming a resist layer on a substrate structure having a reference alignment mark;
    aligning the alignment mark of the imprint template with the reference alignment mark of the substrate structure; and
    imprinting the field patterns on the resist layer to embed the field patterns into the resist layer,
    wherein the embedded alignment mark is formed by irradiating a laser beam into a part of the imprint template to form the alignment mark in the irradiated part of the imprint template.

2. The method of claim 1, wherein the alignment mark is formed to have a lower light transmittance than the imprint template by changing the phase of the irradiated part of the imprint template into a crystalline phase from an amorphous state.

3. The method of claim 1, wherein the imprint template is comprised of a transparent material through which an ultraviolet ray or a visible ray passes.

4. The method of claim 1, wherein the field patterns are defined by a concave and convex surface profile of the at least one field region and wherein the alignment mark is located at substantially the same level as bottom surfaces of concave regions of the field patterns.

5. The method of claim 1,
    wherein the alignment mark is located at a certain depth from the flat surface of the imprint template, which is substantially coplanar with end surfaces of the field patterns; and
    wherein the certain depth is less than a height of the field patterns.

6. The method of claim 1, wherein the surface of the imprint template that is adjacent to the alignment mark and which comes into contact with the resist layer during the imprinting of the field patterns is substantially flat.

7. The method of claim 1, further comprising:
    irradiating an ultraviolet ray onto the aligned imprint template to cure the resist layer.

8. The method of claim 1, wherein the forming the resist layer includes:
    spin-coating or drop dispensing or ink jetting a resist material on the substrate structure.

9. The method of claim 1, wherein the imprint template includes two or more field regions spaced apart from one another and the boundary region includes an intermediate boundary region disposed between adjacent field regions and an edge boundary region surrounding the two or more field regions and the intermediate boundary region.

10. A method of performing a nanoimprint lithography process, the method comprising:
    providing a first imprint template including first field patterns and a first alignment mark, wherein the first field patterns are defined by a concave and convex surface profile of the first imprint template and the first alignment mark is embedded in a mesa portion of the first imprint template;
    sequentially forming a first pattern target layer and a first resist layer on a substrate having a reference alignment mark;
    performing a first imprint process for embedding the first field patterns into the first resist layer to form first resist patterns while the first imprint template is aligned with the substrate using a relative position of the first alignment mark to the reference alignment mark;
    etching the first pattern target layer using the first resist patterns as etch masks to form first target patterns;
    forming a second resist layer covering the first target patterns;
    loading a second imprint template onto the second resist layer, wherein the second imprint template includes second field patterns defined by a concave and convex surface profile of the second imprint template and a second alignment mark embedded in a mesa portion of the second imprint template; and
    performing a second imprint process for embedding the second field patterns into the second resist layer while the second imprint template is aligned with the substrate using a relative position of the second alignment mark to the reference alignment mark,
    wherein the providing the first imprint template includes:
    irradiating a laser beam into the mesa portion of the first imprint template to form the first alignment mark in the mesa portion of the first imprint template,
    wherein the first alignment mark is formed to have a light transmittance which is lower than a light transmittance of the mesa portion of the first imprint template.

11. The method of claim 10, wherein the first alignment mark is formed to include portions of the first imprint template, a phase of which is changed into a crystalline phase by irradiation of the laser beam.

12. The method of claim 10, wherein the first alignment mark of the first imprint template and the second alignment mark of the second imprint template are located to vertically overlap with the reference alignment mark during the first and second imprint processes.

13. The method of claim 10,
    wherein the first imprint template has a flat surface that faces the first resist layer; and
    wherein the first alignment mark embedded in the first imprint template is located to be adjacent to the flat surface of the first imprint template.

14. The method of claim 10, further comprising:
    irradiating an ultraviolet ray onto the aligned first imprint template to cure the first resist layer including the first resist patterns before etching the first pattern target layer.

* * * * *